(12) United States Patent
Wong et al.

(10) Patent No.: US 7,064,433 B2
(45) Date of Patent: Jun. 20, 2006

(54) MULTIPLE-BALL WIRE BONDS

(75) Inventors: Yam Mo Wong, Singapore (SG); Jin Siong Joshua Soh, Singapore (SG)

(73) Assignee: ASM Technology Singapore PTE LTD, Singapore (SG)

( * ) Notice: Subject to any disclaimer, the term of this patent is extended or adjusted under 35 U.S.C. 154(b) by 3 days.

(21) Appl. No.: 10/790,969

(22) Filed: Mar. 1, 2004

(65) Prior Publication Data

US 2005/0191839 A1    Sep. 1, 2005

(51) Int. Cl.
*H01L 23/48* (2006.01)
*H01L 23/52* (2006.01)
*H01L 29/40* (2006.01)

(52) U.S. Cl. .................... 257/737; 257/738
(58) Field of Classification Search .......... 257/737, 257/738, 780
See application file for complete search history.

(56) References Cited

U.S. PATENT DOCUMENTS

| | | | |
|---|---|---|---|
| 6,429,028 B1 * | 8/2002 | Young et al. | 438/4 |
| 6,583,483 B1 * | 6/2003 | Masumoto et al. | 257/459 |
| 6,864,587 B1 * | 3/2005 | Shibata | 257/784 |

* cited by examiner

*Primary Examiner*—Phat X. Cao
(74) *Attorney, Agent, or Firm*—Ostrolenk, Faber, Gerb & Soffen, LLP

(57) ABSTRACT

The invention provides a wire bond comprising multiple ball bonds and a method of forming the wire bond to bond a wire to a connection pad of an electronic device. The wire bond comprises a first bump ball formed on the connection pad and a second bump ball formed on the connection pad that is contiguous with the first bump ball.

12 Claims, 3 Drawing Sheets

MULTIPLE-BALL WIRE BONDS

FIELD OF THE INVENTION

The invention relates to the formation of an electrical connection between a conductive wire and a connection pad of an electronic device, and in particular to forming a wire bond to attach the wire to the connection pad.

BACKGROUND AND PRIOR ART

Wire bonding is a method used in the semiconductor industry to attach a fine wire, commonly 1 to 3 mils in diameter, from one connection pad to another to complete an electrical connection between electronic devices. The most widely used wire materials are Gold (Au) and Aluminum (Al), but Silver (Ag) and Copper (Cu) are also used. The connection pads may comprise metallized bond sites on a semiconductor chip or on interconnection substrates. A semiconductor chip can also be wire bonded to a metal leadframe as is done in plastic encapsulated devices.

A typical method used to bond or weld the wire to a connection pad is through a combination of heat, pressure and/or ultrasonic energy. It is a solid phase welding process, wherein the two metallic materials (the wire and the pad surface) are brought into intimate contact. Once the surfaces are in intimate contact, electron sharing or interdiffusion of atoms takes place, resulting in the formation of a wire bond. The bonding force can lead to material deformation, breaking up of a contamination layer and smoothing out of surface asperity, which can be enhanced by the application of ultrasonic energy. Heat can accelerate inter-atomic diffusion, thus forming the bond.

One type of wire bond formation uses a ball bond. The process involves melting a sphere of wire material on a length of wire held by a capillary, which is lowered and welded to a first bonding position. The capillary then draws out a loop and then connects the wire to a second bond position using a wedge bond that is usually of a crescent shape. Another ball is then reformed for a subsequent first ball bond. Currently, gold ball bonding is the most widely used bonding technique. Its advantage is that once the ball bond is made on the connection pad of a device, the wire may be moved in any direction without stress on the wire, which greatly facilitates automatic wire bonding.

Current wire bonding techniques depend very much on the area of contact between the formed ball and the connection pad of the electronic device for adequately securing the connection. Over the years, the demand for fine-pitch bonding (such as with wires having diameters of less than 50 μm) has increased steadily, thus making effective bonding more difficult since there is a smaller surface area for contact between the wire bond and the connection pad. Furthermore, probe testing of semiconductor devices has become the norm. Probe testing may cause the surfaces of the connection pads to be damaged, leaving probe marks on the connection pads which might be rough or have an underlayer material exposed, thus adding to the difficulty to form an effective bond since good intermetallization is harder to achieve.

Another problem associated with fine-pitch bonding is that if an insufficient amount of ultrasonic energy or bond force is applied during bonding, ball lift occurs when the adhering force between the ball bond and the connection pad is not strong enough. Conversely, if too much ultrasonic energy or bond force is applied, this may lead to metal peel or cratering on the surface of the connection pad. Moreover, in fine-pitch ball bonding, a parameter window for forming a good bond is comparatively smaller. Therefore, the aforementioned faults would have a tendency to occur either due to the sensitivity of the connection pad of the wafer or other semiconductor device, or due to the parameters not being properly optimized.

In order to improve the intermetallization between the ball bond and the connection pad, one method is to increase the ball size. Unfortunately, the size of the ball is restricted to the size of the opening offered by the connection pad which is smaller for smaller devices. Another method is to increase the ultrasonic energy transmitted to the ball bond during bonding. However, this method increases the risk of metal peel or cratering if the wafer or semiconductor device is sensitive, As mentioned above, probe marking on the die surface also reduces intermetallization. Thus, rectangular pad opening designs have been adopted over recent years so that bonding on the probe mark can be partially avoided. Even so, there is no certainty that the probe mark can be sufficiently avoided during bonding in order to increase the contact area between the ball bond and the connection pad to achieve better intermetallization. Therefore, prior art bonding methods face obstacles in improving the quality of bond adhesion due to the aforesaid limitations,

SUMMARY OF THE INVENTION

It is an object of the invention to provide a method of increasing shear strength of a wire bond so as to improve the quality of the bond. It is another object of the invention to increase an area of contact between a wire bond and a connection pad of an electronic device so as to create better adhesion between the wire bond and the connection pad.

According to a first aspect of the invention, there is provided a method of forming a wire bond bonding a wire to a connection pad of an electronic device comprising the steps of forming a first bump ball on the connection pad and then forming a second bump ball on the connection pad that is contiguous with the first bump ball.

According to a second aspect of the invention, there is provided a wire bond bonding a wire to a connection pad of an electronic device comprising a first bump ball formed on the connection pad and a second bump ball formed on the connection pad that is contiguous with the first bump ball.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a method of bonding in accordance with the invention will now be described with reference to the accompanying drawings, in which.

DETAILED DESCRIPTION OF THE PREFERRED EMBODIMENTS

Figure 1:
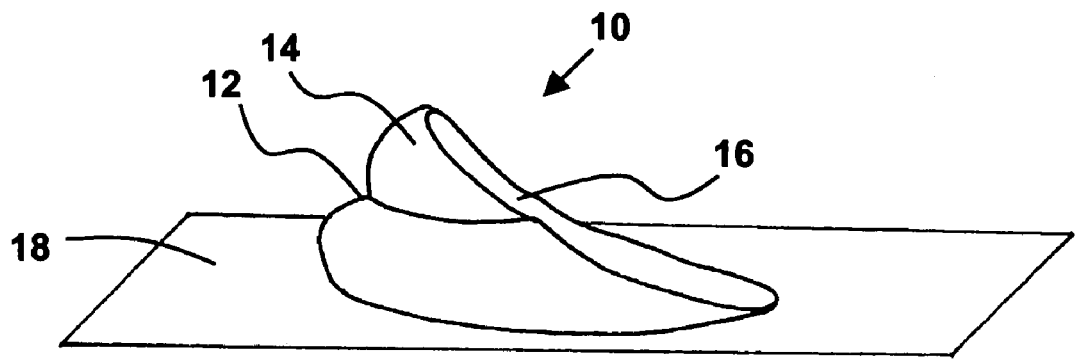
FIG. 1 shows a side view of a single edged bump ball.

FIG. 1 shows a side view of a first bump ball 12, such as a single edged bump ball formed on a connection pad 18 of an electronic device 10 at a first bonding position. The first bump ball 12 is formed by first bonding a bump created out of a melted ball of wire at a position that is slightly offset from a center of a connection pad 18 to which a wire connection is to be made. The position of this first bump ball 12 is programmable by moving a capillary of a wire bonding device (not shown) holding the wire to the said position and lowering the melted ball onto the connection pad before bonding it at that position. The capillary is then lifted slightly. Thereafter, relative movement between the capillary and the connection pad 18 is activated for a predetermined distance. The movement can be achieved either by movement of the capillary and/or by movement of a worktable on which the electronic device is mounted.

Once the capillary has been moved away from the bump by the said distance, the capillary is lowered onto the bump and ultrasonic energy is generated while applying pressure onto the bump. The wire is then severed or broken off from the bump. By utilizing these motions, the edged bump ball that is formed out of the first bump ball 12 has a bump ball portion 14 and a recessed portion 16.

Figure 2:
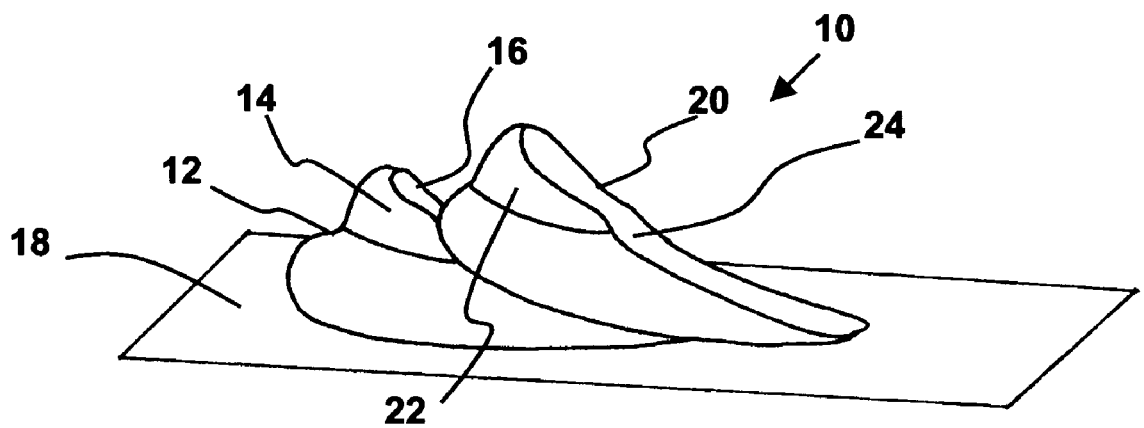
FIG. 2 shows an isometric view of two overlapping edged bump balls formed next to each other.

If the size of the opening of the connection pad 18 is large enough, a second bump ball 20 in the form of a second edged bump ball can be formed next to the first edged bump ball 12. FIG. 2 shows an isometric view of two overlapping edged bump balls 12, 20 formed next to each other. To form the second bump ball 20, the capillary is positioned above a base of the recessed portion 16 of the first bump ball 12. As with the formation of the first bump ball 12, the capillary is lowered onto the recessed portion 16 and a bump is bonded at that position. The capillary is lifted and then moved relatively for a predetermined distance away from the second bump ball 20 and the first bump ball 12. Thereafter, the capillary is lowered onto the second bump ball 20 that was just bonded and ultrasonic energy and force are applied to this bump. The wire is then severed from this bump.

In this manner, the second bump ball 20 is formed which also comprises a bump ball portion 22 and a recessed portion 24. An advantage of having the second bump ball 20 that is edged in addition to the first edged bump ball 12 is to increase the area of contact between the wire bond and the connection pad 18. This would tend to improve overall adhesion strength of the wire bond. It should be noted that the base of the second bump ball 20 overlaps the recessed portion 16 of the first bump ball 12 so that electrical conductivity is maintained between the first and second bump balls 12, 20.

Figure 3:
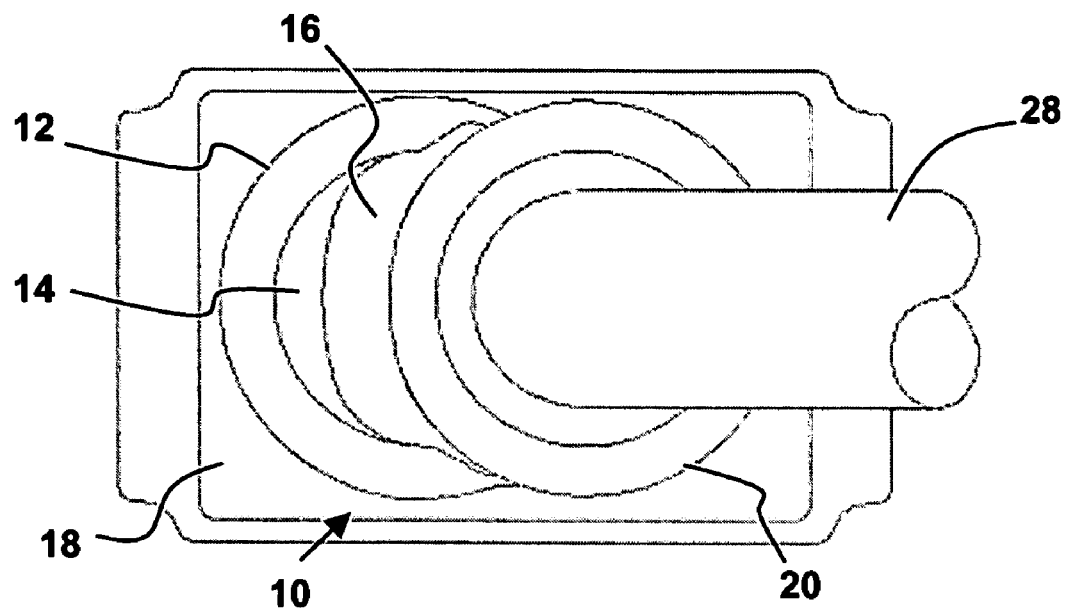
FIG. 3 shows a top view of a single edged bump ball with an overlapping bump ball with wire extending from it according to a first preferred embodiment of the invention.

FIG. 3 shows a top view of a single edged bump ball 12 with a second bump ball 20 in the form of an overlapping bump ball with wire 28 extending from it according to a first preferred embodiment of the invention. The second bump ball 26 is formed on the connection pad and is contiguous with the first bump ball 12 that was formed. To form the overlapping bump ball, the capillary is positioned over a base of the recessed portion 16 of the first edged bump ball 12. A ball melted on the wire at the tip of the capillary is lowered onto the base of the recessed portion 16, and the bump ball 26 is bonded at that position. The second bump ball 26 lies partly on the base of the recessed portion 16 of the first bump ball 12 and partly on the connection pad 18. The capillary is then lifted and the wire 28 is extended from the second bump ball 26. Subsequently, the capillary is moved to a second bonding position in order to connect the wire 28 to a second bonding position from the first bonding position on the connection pad 18.

Figure 4:
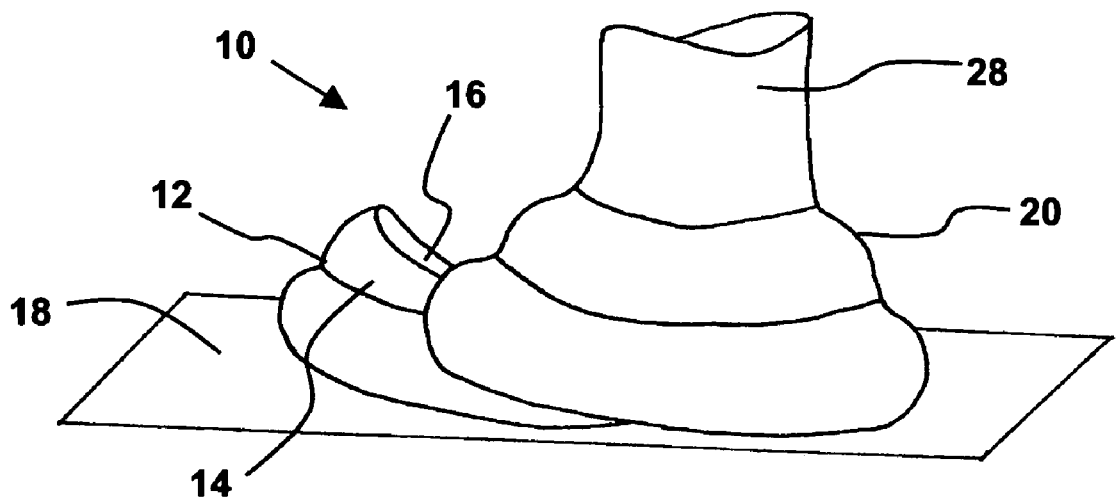
FIG. 4 shows a side view of the edged bump ball with an overlapping bump ball connected next to it as in FIG. 3.

FIG. 4 shows a side view of the edged first bump ball 12 with an overlapping second bump ball 20 connected next to it as in FIG. 3. This view further illustrates that the contact area between the wire bond (comprising the first bump ball 12 and the second bump ball 20) and the connection pad 18 is substantially increased as compared to just forming a single bump ball on the connection pad 18. Adhesion strength can therefore be increased without resorting to prior art methods of increasing pad size or bump ball diameter (which is not efficient or feasible especially for fine-pitching bonding, such as for wire diameters of less than 50 µm) or increasing ultrasonic or bonding energy during bonding (which might damage the surface of the connection pad 18.

Figure 5:
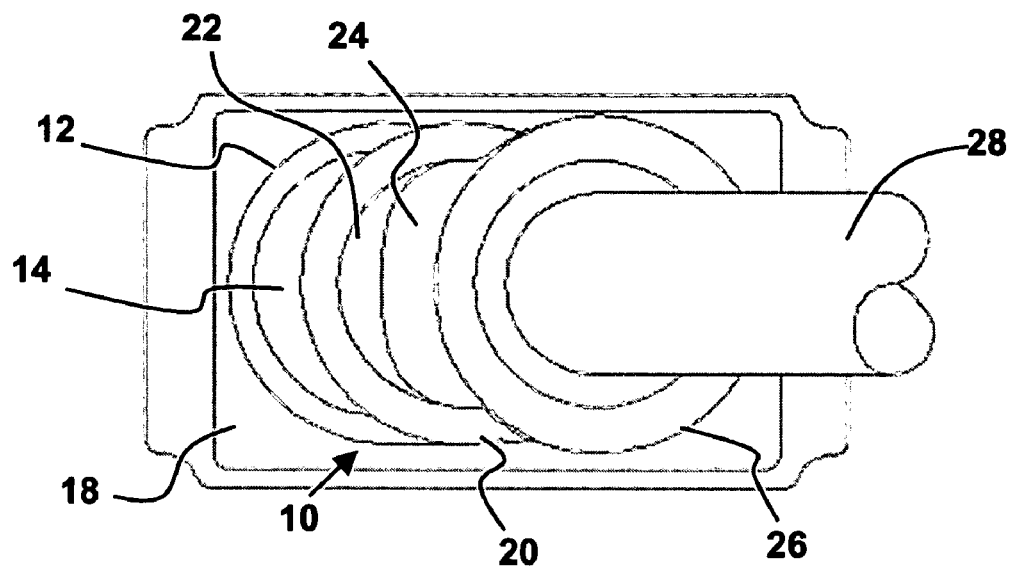
FIG. 5 shows a top view of two overlapping edged bump balls with an overlapping bump ball and wire extending from it according to a second preferred embodiment of the invention.

FIG. 5 shows a top view of first and second bump balls 12, 20 in the form of two overlapping edged bump balls with a third bump ball 26 in the form of an overlapping bump ball with wire 28 extending from it according to a second preferred embodiment of the invention. Generally, there are various positions that the third bump ball 26 may be placed so as to be contiguous with the other bump balls 12, 20, such as by forming it next to the first bump ball, or second bump ball, or in between the first and second bump balls. As mentioned above, the third bump ball can be formed if the size of the opening of the connection pad 18 is large enough and serves to further increase the contact surface between the wire bond and the connection pad 18, which in turn improves intermetallization and adhesion.

The first and second bump balls 12, 20 in the form of two edged bump balls are first formed as described in relation to FIG. 2. Thereafter, the capillary is positioned above a base of the recessed portion 24 of the second edged bump ball 20. It should be appreciated that the recessed portion could be formed in the first bump ball instead for receiving the third bump ball 26. A ball melted on the wire near a tip of the capillary and the ball is lowered to partially contact the base of the recessed portion 24 and partially contact the connection pad 18. Ultrasonic energy and force are applied to the ball to form the third bump ball 26, which partially lies on the base of the recessed portion 24 and partially lies on the connection pad 18. The capillary is then lifted and the wire 28 is extended from the third bump ball 26. The capillary is moved to a second bonding position whereat a second bond is formed, thus completing an electrical connection from the first bonding position to the second bonding position.

Figure 6:
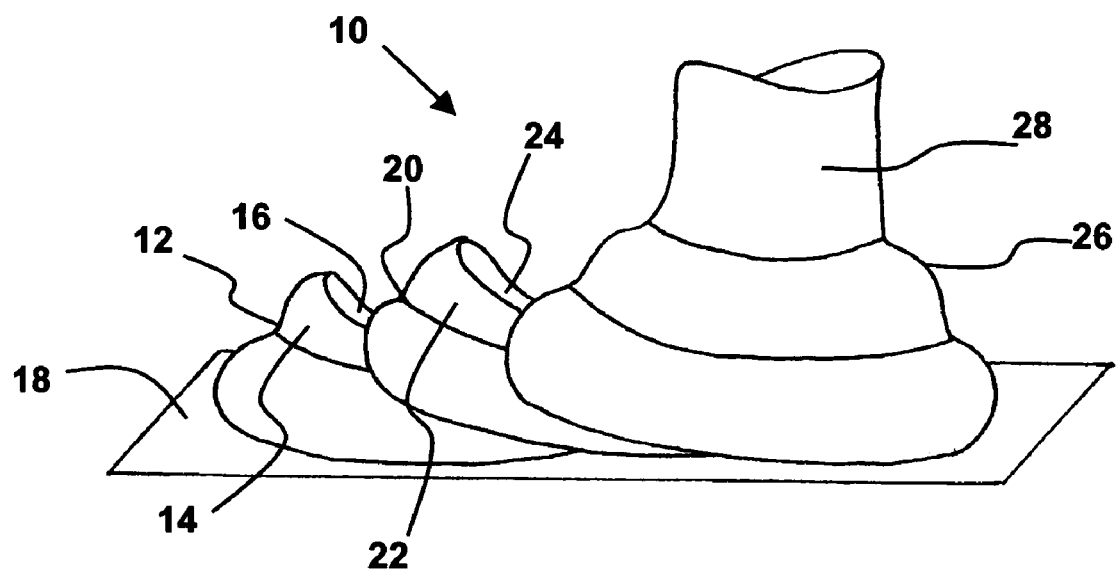
FIG. 6 shows a side view of the two overlapping edged bump balls with an overlapping bump ball connected next to them as in FIG. 5.

FIG. 6 shows a side view of the first and second bump balls 12, 20 in the form of two overlapping edged bump balls with a third bump ball 26 in the form of an overlapping bump ball connected next to them as in FIG. 5. Again, it illustrates that the contact area between the wire bond (comprising the first second and third bump balls 12, 20, 26) on the one hand, and the connection pad 18 on the other, is increased. The intermetallization and adhesion would thus be greater than simply having a wire bond comprising a single bump ball, or a wire bond comprising a bump ball with wire formed next to a single edged bump ball as shown in FIG. 4.

As an example, it was found that the average ball shear for a bump ball formed on a connection pad 18 using conventional wire bonding methods without any edged first or second bump balls 12, 20 according to a particular set of parameters was 15 grams. That means that the wire bond was dislocatable by applying a shearing force of 15 grams or more. When second bump ball 20 with wire connected to it was bonded on a single edged bump ball 12 (see FIGS. 3 and 4) using a similar set of parameters, the average ball shear increased to 26 grams. Furthermore, when a third bump ball 26 was bonded together with first and second edged bump balls 12, 20 (see FIGS. 5 and 6) using a similar set of parameters, the average ball shear was significantly increased to 33 grams. This was 18 grams higher than that achieved from a conventional method of a bump ball formed without any edged bump ball, or an increase of adhesion strength of 120% over the conventional method.

It would be appreciated that an advantage of this method is that no increase in ultrasonic power for forming each bond is required to obtain the improvement in shear strength. Therefore, metal peel or cratering can be avoided or reduced as compared to the prior art. Another advantage is that a smaller ball size can be used to bond a wire to a larger opening of a connection pad. For example, a ball size of 26 µm can be used to bond on a pad pitch of 50 µm. Thus, greater precision can be achieved during bonding. With the said advantages, parameter optimization for forming the first bond can be made simpler and more accurate.

A related advantage is that under fine-pitch bonding, a fine wire cannot form a very big ball due to its small wire size. This constraint can also be overcome by the preferred embodiments of the invention, so that ball shear strength can be improved without the need for using thick wire, which cost more. As a result, cost savings can be achieved.

The invention described herein is susceptible to variations, modifications and/or additions other than those specifically described and it is to be understood that the invention includes all such variations, modifications and/or additions which fall within the spirit and scope of the above description.

The invention claimed:

1. A method of forming a wire bond bonding a wire to a connection pad of an electronic device comprising the steps of:

forming a first bump ball on the connection pad;
edging the first bump ball and forming a recessed portion in the bump ball; and then
forming a second bump ball on the connection pad that is contiguous with the first bump ball.

2. A method as claimed in claim 1, including extending the wire from the second bump ball.

3. A method as claimed in claim 1, wherein the second bump ball partially lies on the connection pad and partially lies on the first bump ball.

4. A method as claimed in claim 1, including severing the wire from the first bump ball prior to forming the second bump ball.

5. A method as claimed in claim 1, wherein the second bump ball is formed on the recessed portion of the first bump ball.

6. A method as claimed in claim 1, wherein the diameter of the wire is less than 50 µm.

7. A wire bond formed according to the method of claim 1.

8. An electronic device including wire bonds as claimed in claim 7.

9. A method of forming a wire bond bonding a wire to a connection pad of an electronic device comprising the steps of:

forming a first bump ball on the connection pad;
forming a second bump ball on the connection pad that is contiguous with the first bump ball;
edging the first and/or second bump ball and forming a recessed portion in the first and/or second bump ball; and then
forming an additional bump ball that is contiguous with the first and/or second bump ball.

10. A method as claimed in claim 9, including extending the wire from the additional bump ball.

11. A method as claimed in claim 9, including severing the wire from the second bump ball prior to forming the additional bump ball.

12. A method as claimed in claim 9, wherein the additional bump ball is formed on the recessed portion of the first or second bump ball.

* * * * *